United States Patent [19]

Dam et al.

[11] Patent Number: 5,168,189
[45] Date of Patent: Dec. 1, 1992

[54] SOLDERLESS CONNECTOR FOR A SOLID STATE MOTOR STACK

[75] Inventors: Chuong Q. Dam, Peoria; Virgil R. Hester, Delavan; Kurtis C. Kelley, Washington, all of Ill.; Carey A. Towe, North Augusta, S.C.

[73] Assignee: Caterpillar Inc., Peoria, Ill.

[21] Appl. No.: 761,543

[22] Filed: Sep. 18, 1991

[51] Int. Cl.$^5$ .................................. H01L 41/08
[52] U.S. Cl. .................................. 310/328; 310/365; 310/366
[58] Field of Search ............... 310/323, 328, 363–366, 310/325

[56] References Cited

U.S. PATENT DOCUMENTS

| | | | |
|---|---|---|---|
| 3,501,099 | 3/1970 | Benson | 310/328 |
| 3,589,345 | 6/1971 | Benson | 310/328 |
| 4,231,287 | 11/1980 | Smiley | 310/328 |
| 4,438,363 | 3/1984 | Babitzka et al. | 310/328 |
| 4,460,842 | 7/1984 | Waanders et al. | 310/338 |
| 4,471,256 | 9/1984 | Igashira et al. | 310/328 |
| 4,499,566 | 2/1985 | Abbott | 310/337 X |
| 4,633,120 | 12/1986 | Sato et al. | 310/328 |
| 4,701,659 | 10/1987 | Fujii et al. | 310/334 |
| 4,752,712 | 6/1988 | Tomita et al. | 310/328 |
| 4,783,610 | 11/1988 | Asano | 310/328 |
| 4,803,393 | 2/1989 | Takahashi | 310/328 |
| 4,803,763 | 2/1989 | Eturo et al. | 310/328 |
| 4,885,498 | 12/1989 | Wakita | 310/328 |
| 4,978,881 | 12/1990 | Wakita et al. | 310/328 |
| 5,012,835 | 5/1991 | Ikehata et al. | 310/328 |

FOREIGN PATENT DOCUMENTS

| | | | |
|---|---|---|---|
| 52-35994 | 3/1977 | Japan . | |
| 60-39878 | 1/1985 | Japan . | |
| 0121784 | 6/1985 | Japan | 310/366 |
| 60-103685 | 7/1985 | Japan . | |
| 60-176282 | 10/1985 | Japan . | |
| 0258485 | 11/1986 | Japan | 310/346 |
| 0276278 | 12/1986 | Japan | 310/366 |
| 0031182 | 2/1987 | Japan | 310/366 |
| 62-165381 | 7/1987 | Japan . | |
| 62-262472 | 11/1987 | Japan . | |
| 62-291080 | 12/1987 | Japan . | |
| 0055985 | 3/1988 | Japan | 310/366 |
| 0088875 | 4/1988 | Japan | 310/366 |
| 63-92068 | 4/1988 | Japan . | |

OTHER PUBLICATIONS

Paper prepared by Physics International Company, San Leandro, Calif. entitled "Piezoelectric Materials", pp. 1–16.

Primary Examiner—Mark O. Budd
Attorney, Agent, or Firm—Sterne, Kessler, Goldstein & Fox

[57] ABSTRACT

A piezoelectric solid state motor includes first and second solderless connectors for connecting first and second chain electrodes, respectively, to a power supply connector. The first and second chain electrodes are interleaved with a plurality of piezoelectric disks, such that the motor expands in an axial direction when a driving potential is applied to the solderless connectors. Each solderless connector comprises a first planar member formed of an electrically conductive material, for placement in electrical communication with one of the first and second chain electrodes, and a second planar member formed integrally with the first planar member for placement in electrical communication with the power supply connector.

8 Claims, 2 Drawing Sheets

SOLDERLESS CONNECTOR FOR A SOLID STATE MOTOR STACK

BACKGROUND OF THE INVENTION

1. Field of the Invention

The field of the invention relates generally to solid state motor actuators. More particularly, the invention relates to a piezoelectric solid state motor with a solderless connector for connecting electrodes to a power source.

2. Related Art

For decades electroexpansive materials have been employed in stacked structures for producing actuation used for fuel injection and valve control in diesel engines, for example. Commercially manufactured solid state motor stacks, or actuators, are produced using piezoelectric disks interleaved with metal foil electrodes. Application of high voltage (e.g., 1000 v dc), low current power to alternately biased electrodes causes each of the piezoelectric disks to expand or axially distort. The additive deflection of the stacked disks is typically amplified by hydraulics to effectuate useful actuation.

An example of a conventional electromechanical actuator having an active element of electroexpansive material is found in U.S. Pat. No. 3,501,099 to Glendon M. Benson (the '099 patent). The '099 patent is directed to both an actuation amplification structure and a method for manufacturing piezoelectric stacks.

The method for manufacturing piezoelectric stacks is essentially comprised of the following steps. Sheets of ceramic material are rolled, compacted and punched into ceramic disks. After a cleaning process, the disks are stacked with alternate sets of continuous disk electrodes disposed between the ceramic disks.

Alternate electrodes of each disk/electrode structure (stack) are interconnected to one another using straps, thereby forming a first electrode group. A second electrode group is similarly interconnected. Each electrode group is called a "chain electrode".

The stacks then undergo a pressurized cool-welding process, followed by an elevated temperature and pressure bonding process after lead wire electrodes are connected to the two chain electrodes. The stacks are poled by application of a dc voltage, and are then encapsulated with a plastic insulative cover prior to final mounting within a transducer housing.

The '099 patent's electrode structure represents a common serial approach to electrode interconnection. Another common interconnection scheme is the bus bar approach.

The bus bar scheme uses a common bar or wire to connect every other electrode in a parallel fashion. Each electrode includes a tab portion extending tangentially from a point on the circumference of the electrode. The tabs facilitate soldering or welding of the bus bar to the electrodes. Conventionally, each stack uses two bus bars to connect the power supply leads to the two respective electrode groups.

Both of the above discussed electrode interconnection structures suffer from various disadvantages. The chain electrode structure makes assembly of ceramic disk/electrode stacks difficult, and the foil conventionally used for the chain electrode is fragile. In contrast, structurally, the bus bar becomes somewhat ridge due to the soldering of the many tabs, thus, inhibiting stack actuation. Further, assembly and soldering of the bus bar structure requires many process steps.

The present invention overcomes the deficiencies of the conventional technology noted above.

SUMMARY OF THE INVENTION

The present invention is directed to a piezoelectric solid state motor, having a power supply connector, a plurality of piezoelectric disks, and first and second chain electrodes interleaved with the piezoelectric disks, such that the motor expands in an axial direction when a driving potential is applied to the electrodes. First and second solderless connectors are used for connecting the first and second chain electrodes, respectively, to the power supply connector. Each solderless connector comprises a first planar member formed of an electrically conductive material, for placement in electrical communication with one of the first and second chain electrodes, and a second planar member formed integrally with the first planar member for placement in electrical communication with the power supply connector.

BRIEF DESCRIPTION OF THE DRAWINGS

The invention will be better understood if reference is made to the accompanying drawings in which:

FIG. 4 shows a circular electrode with an elongated tab in conjunction with the present invention;

DETAILED DESCRIPTION OF THE PREFERRED EMBODIMENTS

Piezoelectric solid state motor stacks according to the present invention are high-force devices that have minimized stack failure due to disk breakage caused by stress. Piezoelectric solid state motor stacks according to the present invention can be used to improve engine performance, reduce emissions, and reduce engine noise. The utility of the present invention is not, however, limited to engine valve and fuel injector actuation. The invention may be used in brake or shock absorbing systems, for example. Moreover, the invention may be used in a wide variety of devices or systems requiring fluid or mechanical actuation, as well as shock or sound wave production.

A particular advantage of the solid state motor stack of this invention is its ability to operate over a wide temperature range. Tests on prototype motor stacks have shown good results in operating environments of $-40°$ C. to $100°$ C. It should be understood that the present invention is directed to piezoelectric solid state motor stack structure. However, the terms solid state motor stack and electroexpansive actuator, for example, are synonymous. Throughout this discussion, the piezoelectric solid state motor stacks will be commonly referred to as "stacks".

Figure 1:
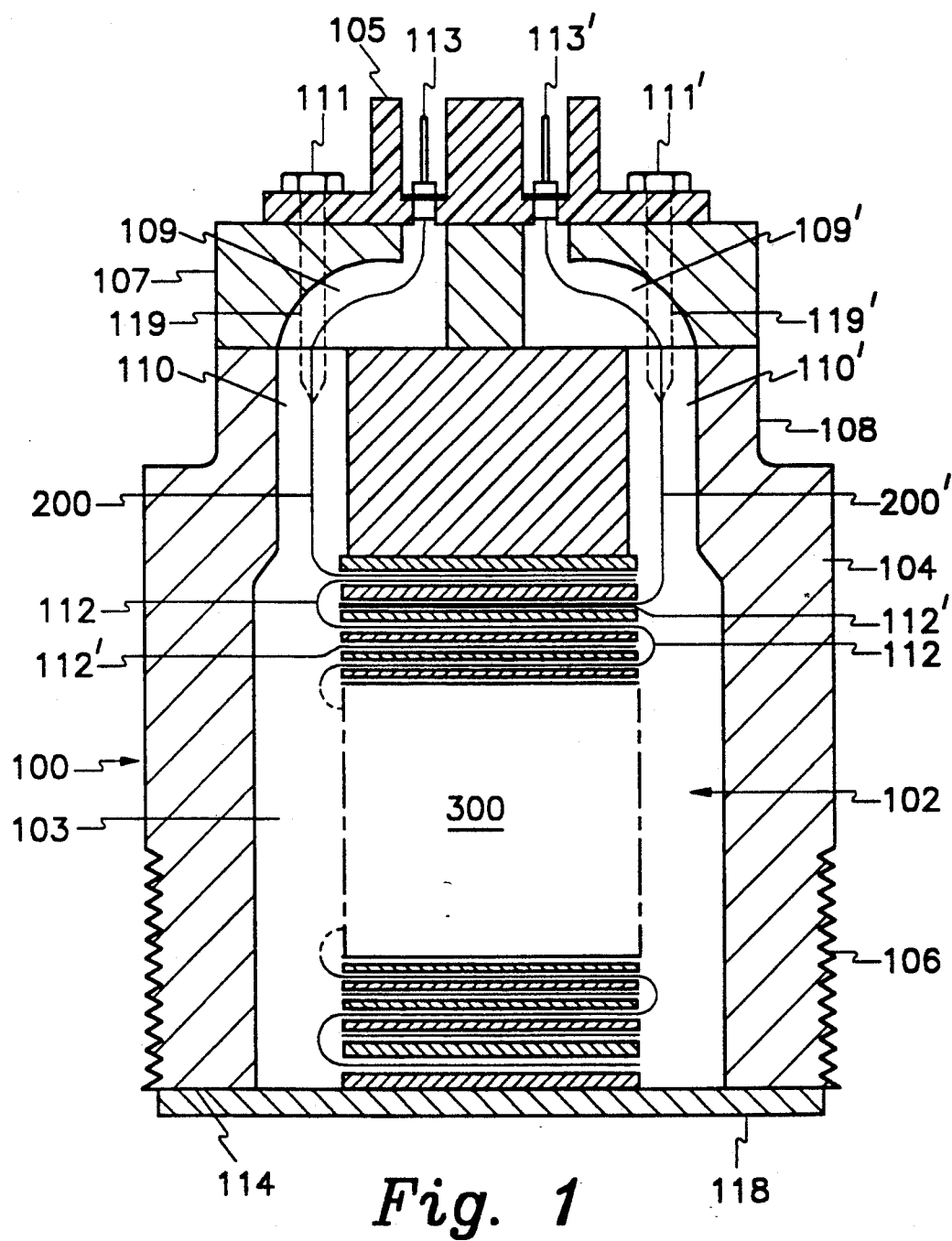
FIG. 1 is a cross-sectional view of a housed piezoelectric stack in conjunction with the present invention.

FIG. 1 shows a piezoelectric solid state stack motor 102 encased in an encapsulant 103 and a housing 104. The housing 104 is a steel case and is cylindrical in shape with a hollow cylindrical cavity for housing the solid state stack. A set of threads 106 are used to attach the piezoelectric solid state motor 102 and the housing 104 to an engine head. A plateau 108 represents a hexagonal cross section, if viewed from the top of FIG. 1. This hexagonal structure is not shown in the figure, but is used for tightening and loosening of the piezoelectric solid state motor housing on the engine head.

Throughports 110, 110' are bored in the top end of the housing 104 to permit two solderless connectors 200 and 200' to exit the housing 104.

Fastening devices 111, 111' are used to secure a power supply connector 105 to the housing 104. The external connector 105 includes two terminals (or pins) 113, 113', for example. The fasteners are used to anchor both the connector 105 and a spacer 107 to the housing. Preferably, the fastener comprises a machine screw which passes through a screw hole in the connector 105 and a channel 109, 109' inside the spacer member 107.

The fastening devices 111, 111' are mated with a set of threaded holes 119, 119' in the upper surface of the housing 104. Preferably, at least two such fasteners are used to secure the connector and spacer to the motor stack housing. The fastening devices lie behind the plane depicted in the figure. Other commonly known fasteners may be used.

A plurality of ceramic disks 300 are interleaved with two chain electrodes 112 and 112'. The solderless connectors 200 and 200' electrically L connect the chain electrodes 112 and 112', respectively, to a power source. An axial displacement is produced between the opposite end surfaces of the stack when a driving potential is applied to the chain electrodes 112 and 112' via the solderless connectors 200, 200' and terminals 113, 113'.

The surface 114 of housing 104 and the exposed surface of the bottom ceramic end cap (see 302' in FIG. 3) must be simultaneously ground to facilitate proper alignment of a steel diaphragm 118 to the end of the stack housing 104. The diaphragm 118 may then be attached to the surface 114 of housing 104 by laser-welding or the like.

The diaphragm is preferably made of stainless steel and has a thickness of about 0.25 mm. The steel diaphragm functions to protect the stack from external contaminates. In addition, the diaphragm prevents the electrode/disk stack from rotating within the housing.

Figure 2:
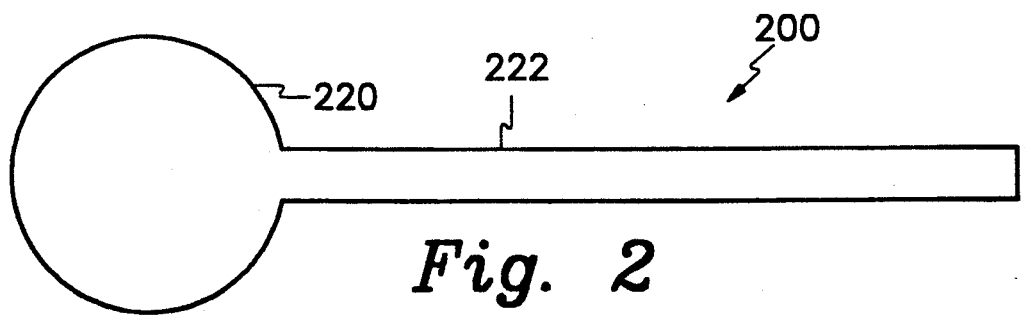
FIG. 2 shows a solderless connector.

The solderless connector for the stack will be discussed with reference to FIG. 2. A solderless connector electrode 200 includes a circular section 220 and an elongated tab section 222. The elongated tab sections 222 of the solderless connector are preferably crimped to the terminals 113, 113' of the connector 105 so that a driving potential from a power source can be applied to the stack in a known manner.

Each solderless connector electrode 200, 200' provides an electrical connection from a corresponding chain electrode to the external electrical connector 105 located on top of the housing 104.

The solderless connector electrodes 200, 200' are preferably thicker that the chain electrodes to provide a more durable connection to the external electrical connector/power supply.

The solderless electrodes 200, 200' are cut or stamped from metal foil using techniques well know in the art. The solderless electrodes may be formed of copper alloys such as brass, or their known equivalents. The dimensions of the circular section 220 and the elongated tab section 222 are not critical to carrying out the present invention, but will become apparent to those working in the art. In a preferred embodiment of the present invention the foil has a thickness of about 0.05 mm. No soldering is required for the connection of the solderless connectors to the chain electrodes. The solderless connectors and the chain electrodes are sandwiched under sufficient pressure by the disks to promote proper electrical connection therebetween.

Figure 3A:
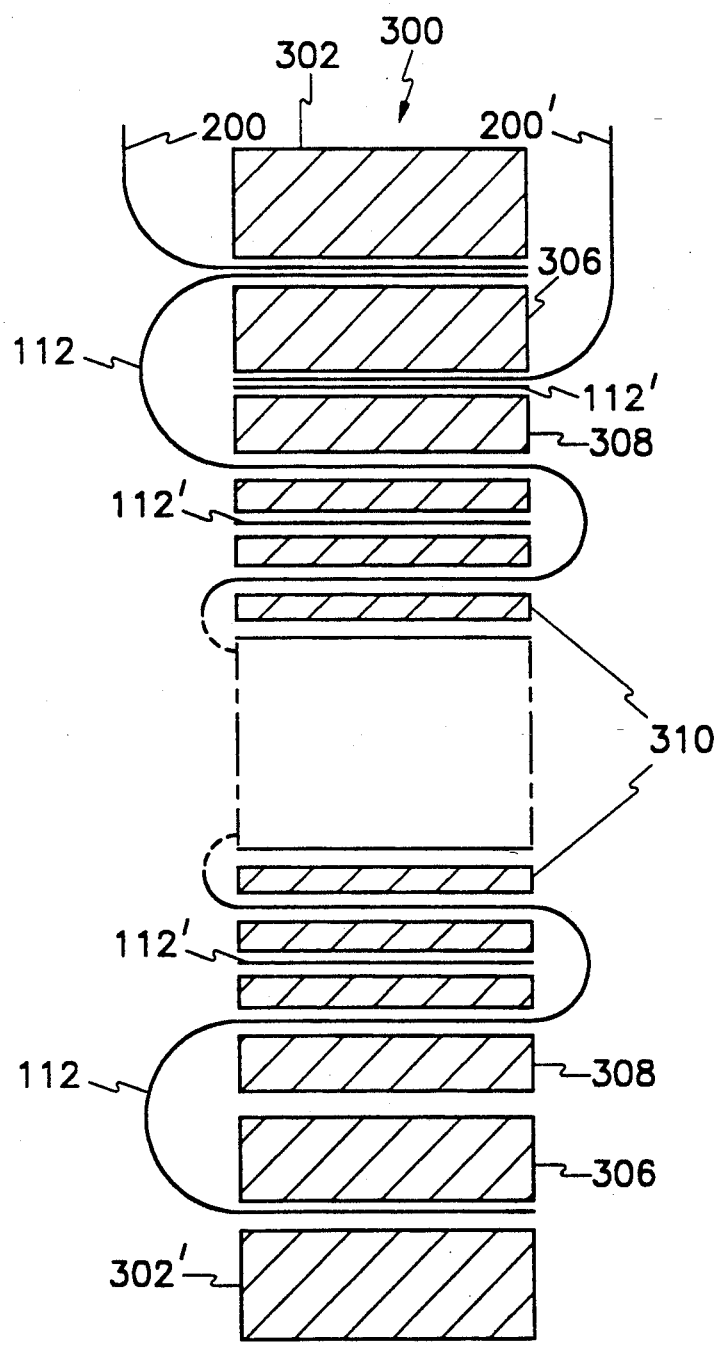
FIG. 3A is an expanded view of a piezoelectric stack in conjunction with the present invention.

FIG. 3A is an expanded diagram of the stack structure 300 showing a plurality of disks 302, 304, 306, 308 and 302', the solderless connectors 200 and 200' and the chain electrodes 112 and 112'. The chain electrodes are interleaved with the plurality of disks. During operation/actuation of the stack the solderless connectors 200 and 200' are biased negative and positive, respectively.

Figure 3B:
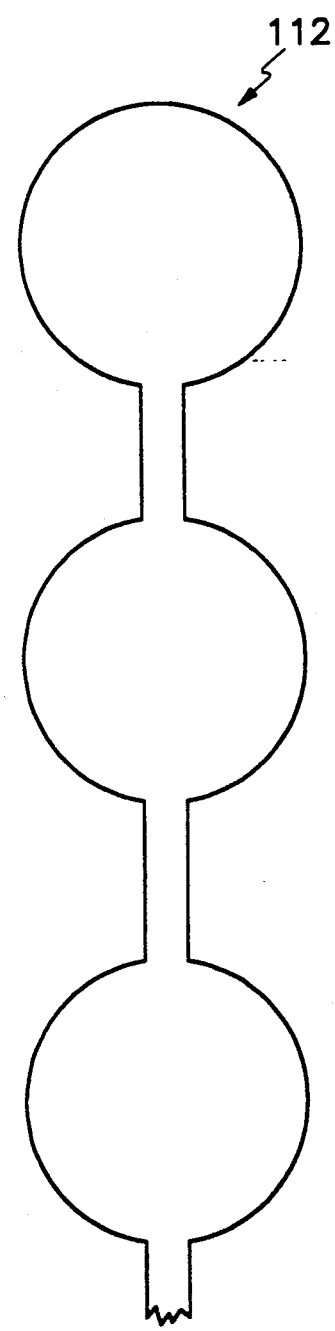
FIG. 3B is a chain electrode.

FIG. 3B shows an example of one of the chain electrodes 112 or 112'. As discussed above, the electrodes 330 are connected in a serial fashion by a plurality of straps 332. The straps of chain electrode 112' are not shown, because this electrode is spaced 90° apart from the chain electrode 112 in the axial direction. The solderless connectors need not be oriented in this fashion. Preferably, the solderless connectors 200 and 200' are on opposite sides of the stack, as shown in FIGS. 1 and 3A.

Ceramic disks suitable for use in making a motor stack are commercially available. The piezoelectric solid state motor stack is bounded by non-polarized ceramic end caps 302, 302'. The stack also includes thick ceramic disks 306, medium thick ceramic disks 308 and inner thin ceramic disks 310.

The thick, medium thick and thin disks have parallel opposing surface facets which are coated with a conductive coating, preferably aluminum. The application of the conductive layer may be accomplished by various methods as would become evident to those of skill in the art. The conductive layer is preferably applied to all of the surface area of the upper and lower facets of the disks. Uniformity of the conductive layer is desired. However, uniformity and full facet surface coverage may be limited by the method used to apply the conductive layer.

The conductive layer may be applied by sputtering, spraying or mechanically rubbing atomic layers of the conductive material onto the facet surfaces of the disks. Chemical vapor deposition may also be used to apply the conductive layer. The conductive layer may also comprise copper, nickel or silver. The conductive layer functions to more evenly spread the electric field across the surface of the disk when a voltage is applied to an adjacent electrode in the final stack structure. The conductive layer is preferably formed on a material (e.g., alloy) that noes not undergo corrosion with the metal used for the solderless connectors and chain electrodes. Corrosion of one or more of the conductive layers will lead to degradation of the solid state motor, and eventually failure.

The inner thin disks 310 are sandwiched by the medium thick disks 308. In a preferred embodiment, an even number (e.g., 72) of disks are used. The combination of the thin and medium thick disks are in turn sandwiched by the thick disks 306, and the combination of the thin, medium thick and thick disks are sandwiched by the end caps 302 and 302'. The first and last electrodes of the structure are of the same potential, preferably ground (i.e., solderless connector 200 is negatively biased). Therefore, no electric field is produced across the end caps when the stack is actuated by application of the power supply voltage.

The thick, medium thick and thin disks have thicknesses of approximately 1.00, 0.76 and 0.50 mm, respectively. The thickness of the end cap 302 is 1.00 mm and the end cap 302' is preferably 2.50 mm.

The assembled, poling of the thick, medium thick, and thin ceramic disks' dipoles is necessary to achieve axial expansion of the piezoelectric ceramic disks upon the application of an electrical potential to the stack. This is preferably done once the stack is assembled in accordance with guidelines provided by the ceramic manufacturer. In the presently preferred embodiment, poling of the stack is accomplished at an elevated temperature (about 145° C.). A poling voltage signal is applied to the stack in three stages. During the first stage a 0-volt to 1200-volt charge is applied linearly during a two-minute interval. For the second stage the voltage is held at 1200-volts for 10 minutes. Finally, the voltage is linearly reduced to 0-volts during a five-minute period.

The stack is then cooled to room temperature. The ceramic end caps are not polarized during the poling process because they are not sandwiched by electrodes.

A power source connector is then be attached to the housing in a known manner. The solderless connectors are electrically attached or positioned to male or female pins within the connector. This permits a power supply harness to be mated with the connector for application of the power supply voltage. Many conventional electrical connection schemes can be adopted, as will become obvious to those skilled in the art.

While various embodiments of the present invention have been described above, it should be understood that they have been presented by way of example, and not limitation. Thus the breadth and scope of the present invention should not be limited by any of the above-described exemplary embodiments, but should be defined only in accordance with the following claims and their equivalents.

We claim:
1. A piezoelectric solid state motor, comprising:
a plurality of piezoelectric disks;
first and second chain electrodes interleaved with said piezoelectric disks such that the motor expands in an axial direction when a driving potential is applied to said electrodes; and
first and second solderless connectors for externally connecting said first and second chain electrodes, respectively, to a source of driving potential, each solderless connector comprising:
a first planar member formed of an electrically conductive material, for placement in electrical communication with a respective one of said first and second chain electrodes and sandwiched between said respective one of said first and second chain electrodes and one of said piezoelectric disks; and
a second planar member formed integrally with said first planar member for placement in electrical communication with the source of driving potential.
2. A piezoelectric solid state motor according to claim 1, wherein:
said first planar member has a substantially circular geometry; and
said second planar member extends outward from a point at the periphery of said first planar member.
3. A piezoelectric solid state motor according to claim 2, wherein said first and second planar members have thicknesses of between approximately 0.0127–0.0508 mm.

4. A piezoelectric solid state motor according to claim 1, wherein said first and second chain electrodes and said first and second solderless electrodes are made of thin conductive material, and the thickness of said first and second solderless connectors is greater than the thickness of said first and second chain electrodes to provide a more durable connection to the source of driving potential than said chain electrodes themselves.
5. A piezoelectric solid state motor according to claim 1, wherein said piezoelectric disks have opposing planar surfaces, and the surfaces of a first group of disks sandwiched by a second group of disks are coated with a substantially thin conductive layer.
6. A piezoelectric solid state motor according to claim 5, said conductive layers comprise a first metal and said first and second chain electrodes are formed of a second metal, said first and second metals having non-corrosive properties with respect to each other.
7. A piezoelectric solid state motor, comprising:
a plurality of piezoelectric disks;
first and second chain electrodes interleaved with said piezoelectric disks such that the motor expands in an axial direction when a driving potential is applied to said electrodes;
first and second solderless connectors for connecting said first and second chain electrodes, respectively, to a source of driving potential, each solderless connector comprising:
a first planar member for placement in electrical communication with a respective one of said first and second chain electrodes and sandwiched between said respective one of said first and second chain electrodes and one of said piezoelectric disks;
a second planar member formed integrally with said first planar member for placing said first planar member and said respective chain electrode in electrical communication with the source of driving potential; and
said first and second chain electrodes and said first an second solderless electrodes being made of thin, electrically conductive material, the thickness of said first and second solderless connectors being greater than the thickness of said first and second chain electrodes to provide a more durable connection to the source of driving potential than said chain electrodes themselves.
8. An internal combustion engine having at least one cylinder having an intake and an exhaust valve, wherein each valve is actuated by a piezoelectric solid state motor, each piezoelectric solid state motor comprising:
a plurality of piezoelectric disks;
first and second chain electrodes interleaved with said piezoelectric disks such that the motor expands in an axial direction when a driving potential is applied to said electrodes;
first and second solderless connectors for connecting said first and second chain electrodes, respectively, to a source of driving potential, each solderless connector comprising:
a first planar member for placement in electrical communication with a respective one of said first and second chain electrodes and sandwiched between said respective one of said first and second chain electrodes and one of said piezoelectric disks;
a second planar member formed integrally with said first planar member for placing said first planar member and said respective chain electrode in electrical communication with the source of driving potential; and said first and second chain electrodes and said first and second solderless electrodes being made of thin, electrically conductive material, the thickness of said first and second solderless connectors being greater than the thickness of said first and second chain electrodes to provide a more durable connection to the source of driving potential than said chain electrodes themselves.

* * * * *